United States Patent
Reese et al.

(10) Patent No.: US 9,638,735 B2
(45) Date of Patent: May 2, 2017

(54) LINEAR VARIABLE DIFFERENTIAL TRANSFORMER (LVDT) EXCITATION WIRING INTERMITTENT FAILURE MONITOR

(71) Applicant: The Boeing Company, Chicago, IL (US)

(72) Inventors: Glenn R. Reese, Swarthmore, PA (US); Joseph A. Schneider, Havertown, PA (US)

(73) Assignee: The Boeing Company, Chicago, IL (US)

( * ) Notice: Subject to any disclaimer, the term of this patent is extended or adjusted under 35 U.S.C. 154(b) by 104 days.

(21) Appl. No.: 14/800,622

(22) Filed: Jul. 15, 2015

(65) Prior Publication Data

US 2017/0016948 A1    Jan. 19, 2017

(51) Int. Cl.
- *G01R 31/02* (2006.01)
- *G01D 5/20* (2006.01)
- *G01D 18/00* (2006.01)
- *G01R 19/10* (2006.01)

(52) U.S. Cl.
CPC ........... *G01R 31/025* (2013.01); *G01D 5/204* (2013.01); *G01D 18/00* (2013.01); *G01R 19/10* (2013.01)

(58) Field of Classification Search
CPC .... G01R 31/02; G01R 31/021; G01R 31/023; G01R 1/07; G01R 15/16; G01R 31/024; G01R 31/1272; G01R 1/22; G01R 19/145; G01R 27/16; G01R 31/00; G01R 27/18; G01R 31/025; G01R 31/08; G01R 31/28; H04B 3/46; G01V 15/00

USPC ....... 324/539–544, 500, 509, 512, 522, 523, 324/528, 531, 551, 555, 557
See application file for complete search history.

(56) References Cited

U.S. PATENT DOCUMENTS

| | | | |
|---|---|---|---|
| 4,133,250 A | 1/1979 | Heintz | |
| 5,896,257 A * | 4/1999 | Takahashi | H02M 7/53875 361/23 |
| 6,078,870 A * | 6/2000 | Windsheimer | G01R 21/133 324/118 |
| 7,138,794 B1 | 11/2006 | Cook et al. | |
| 8,810,273 B1 * | 8/2014 | Kim | G01R 31/40 324/764.01 |
| 2012/0074953 A1 * | 3/2012 | Stickelmann | G01R 19/16538 324/537 |

* cited by examiner

Primary Examiner — Patrick Assouad
Assistant Examiner — Demetrius Pretlow
(74) Attorney, Agent, or Firm — McDonnell Boehnen Hulbert & Berghoff LLP (57) ABSTRACT

Methods and apparatus are provided for detecting faults in excitation wiring. A first sum of a first high voltage and a first low voltage related to a first sensor is determined, where the first sensor is further related to an excitation voltage. A second sum of a second high voltage and a second low voltage related to a second sensor is determined, where the second sensor is further related to the excitation voltage. The excitation voltage is provided to both the first and second sensors using excitation wiring. A determination is made whether each of the first sum and the second sum changes beyond a threshold amount during a first time interval. After determining that each of the first sum and the second sum has changed beyond the threshold amount during the first time interval, an indication of a fault in the excitation wiring is provided.

20 Claims, 7 Drawing Sheets

FIG. 6 und components can include, for example, linear voltage
LINEAR VARIABLE DIFFERENTIAL TRANSFORMER (LVDT) EXCITATION WIRING INTERMITTENT FAILURE MONITOR

BACKGROUND

Position sensors are utilized in many different applications, including in engines and other components of aeronautical, marine, and industrial applications. Such engines and components can include, for example, linear voltage differential transducers (LVDTs) and other types of transducers, such as rotary voltage differential transducers (RVDTs). Such transducers are coupled to actuators, and provide a voltage signal proportional to a designated position of the actuator; e.g., a position of a ram of the actuator.

To detect faults in a transducer, a test can be performed on a range of sums of secondary voltages from the transducer. A range test also can be performed on a sensed position to verify signal integrity. The limits of the range test may be set wide enough to account for all worse-case system variations so that a properly operating transducer is not improperly identified as being faulty. Wide range limits result in only detecting relatively extreme faults; e.g., faults due to electrical open circuits or short circuits.

SUMMARY

In an example embodiment, a method of detecting faults in excitation wiring is provided. A first sum of a first high voltage and a first low voltage related to a first sensor is determined. The first sensor is further related to an excitation voltage. A second sum of a second high voltage and a second low voltage related to a second sensor is determined. The second sensor is further related to the excitation voltage. The excitation voltage is provided to both the first and second sensors using excitation wiring. A determination is made whether each of the first sum and the second sum changes beyond a threshold amount during a first time interval. After determining that each of the first sum and the second sum has changed beyond the threshold amount during the first time interval, an indication of a fault in the excitation wiring is provided.

In another example embodiment, a device is provided. The device includes circuitry that is configured for: determining a first sum of a first high voltage and a first low voltage related to a first sensor, where the first sensor is further related to an excitation voltage; determining a second sum of a second high voltage and a second low voltage related to a second sensor, where the second sensor is further related to the excitation voltage, and where the excitation voltage is provided to both the first and second sensors using excitation wiring; determining whether each of the first sum and the second sum changes beyond a threshold amount during a first time interval; and after determining that each of the first sum and the second sum has changed beyond the threshold amount during the first time interval, providing an indication of a fault in the excitation wiring.

In a further example embodiment, a computing device is provided. The computing device includes one or more processors and computer readable media. The computer readable media is configured to store at least program code that, when executed by the one or more processors, causes the computing device to perform functions. The functions include: determining a first sum of a first high voltage and a first low voltage related to a first sensor, where the first sensor is further related to an excitation voltage; determining a second sum of a second high voltage and a second low voltage related to a second sensor, wherein the second sensor is further related to the excitation voltage, and wherein the excitation voltage is provided to both the first and second sensors using excitation wiring; determining whether each of the first sum and the second sum changes beyond a threshold amount during a first time interval; and after determining that each of the first sum and the second sum has changed beyond the threshold amount during the first time interval, providing an indication of a fault in the excitation wiring.

It should be understood that the description provided in this summary section and elsewhere in this document is intended to illustrate aspects of the present disclosure by way of non-limiting example. Generally, the features, functions, components, and advantages that are discussed herein can be achieved independently in various embodiments or may be combined in yet other embodiments, further details of which are disclosed in the following description and the accompanying drawings.

DETAILED DESCRIPTION

Some flight control systems in modern aircraft have fault detection monitors for detecting and isolate component failures. When a failure is detected by a current fault detection monitor, the post-failure troubleshooting procedure can specify execution of a Maintenance Built-In-Test (MBIT) for a failed assembly, such as an actuator, for further isolation once the flight is complete. If the failure involves permanent damage, then the MBIT can correctly isolate the failure to the correct component to be changed or repaired.

Some aircraft, such as rotorcraft, are subject to high vibrations that can lead to intermittent failures, particularly in aircraft wiring, such as wiring of a swashplate actuator that positions a rotor of the rotorcraft. Current fault detection monitors are often unable to distinguish intermittent wiring failures from permanent failures. Intermittent wiring failures can be caused by open circuits, short circuits and transients that are dependent on environmental conditions, such as vibration, temperature, or other dynamic conditions. On the ground, these environmental conditions may not occur, so the intermittent fault does not manifest and makes troubleshooting difficult.

If a failure is an intermittent wiring failure, then the post-flight MBIT may not be able to isolate the fault; e.g., when the fault is not manifest during the MBIT. If the MBIT runs and passes because the intermittent fault is not present during MBIT execution, the aircraft may be cleared to fly because the MBIT has passed. If the intermittent fault occurs for a second time, then troubleshooting procedure can involve a wiring check. Since the fault it is intermittent, the wiring check may well pass, and so the assembly may be replaced. If the fault returns after the assembly is replaced, then a flight control computer (FCC) may be replaced. The loop of checking wiring and replacing the assembly or FCC continues until the intermittent wiring failure is found. This check/replace loop leads to leads to unnecessary and expensive component removal, increased maintenance time, and decreased aircraft readiness. For example, in one rotorcraft, about 20% of removals of swashplate actuators are associated with faults that cannot be duplicated.

Linear Variable Differential Transducers (LVDTs) are used as sensors in the flight control systems to measure position(s) of an assembly, such as an actuator. An excitation voltage is applied to a primary coil of an LVDT. Then, corresponding secondary coil output voltages can be converted to position values for the assembly. For example, a difference between two output voltages ($V_{hi}$ and $V_{lo}$) from the secondary coil can be converted to a position of the assembly. Additionally, a sum of output voltages can be used to monitor LVDT health.

Analysis of historical maintenance records and aircraft data indicates that drops or rises in LVDT difference and sum voltages often are caused by a wiring failure, which is often intermittent. If the wiring failure is in excitation wiring providing the excitation voltage, the LVDT sum voltage will drop for each LVDT using the excitation wiring. If the wiring failure is in secondary wiring of the LVDT, the failure can cause the difference and sum voltages to drop or rise, depending on which of the secondary wires fail.

An excitation wiring monitor is disclosed herein that can detect intermittent failures in LVDT excitation wiring during flight of an aircraft, so aiding troubleshooting. The excitation wiring monitor detects intermittent wiring failures when the sum voltage drops for all LVDTs with a common excitation voltage source.

If the monitor finds an intermittent fault in LVDT wiring, then the LVDT wiring (e.g., excitation wiring, secondary wiring) can be replaced before replacing actuators and/or FCCs. Detecting and reporting intermittent wiring failures, especially those that occur during flight, can reduce maintenance time, lead to fewer component removals including removals associated with faults that cannot be duplicated, and increase aircraft readiness.

Figure 1:
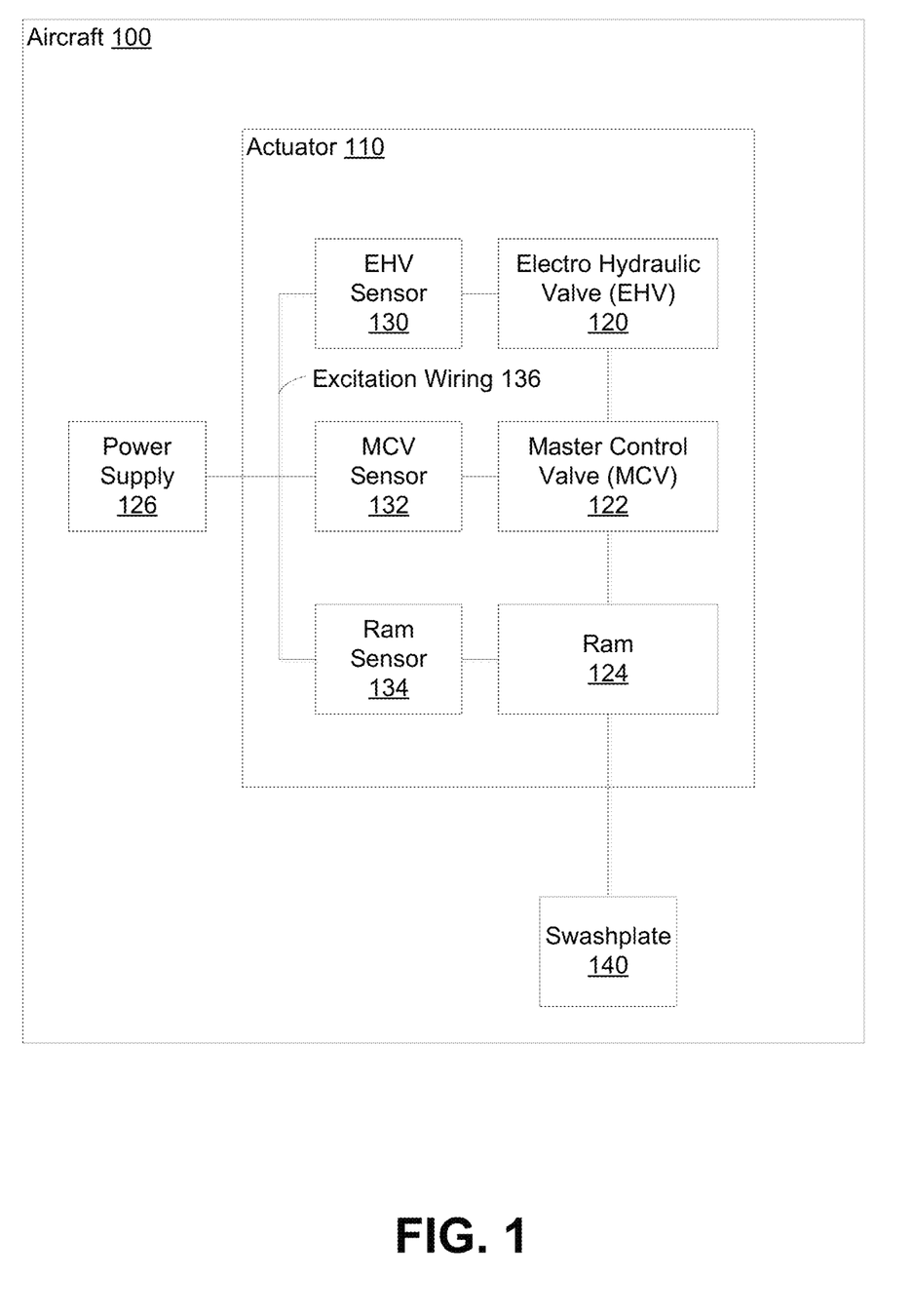
FIG. 1 is a block diagram of an aircraft according to an example embodiment.

Referring now to the figures, FIG. 1 is a block diagram of aircraft 100 according to an example embodiment. Aircraft 100 includes actuator 110, power supply 126, and swashplate 140. Actuator 110 is connected to, and configured to move, swashplate 140, and is also connected to, and configured to receive power from power supply 126. In some embodiments, power supply 126 can be part of actuator 110.

In the embodiment shown in FIG. 1, actuator 110 is a hydraulically powered position control servo that includes electro-hydraulic valve (EHV) 120, master control valve (MCV) 122, and ram 124. Fluid flow from EHV 120 can move or operate MCV 122. MCV 122 governs fluid connections within actuator 110 including the fluid flow to ram 124 in order to control a position of swashplate 140. To move swashplate 140, ram 124 can be coupled via a mechanical connection device to an external member to effect position control of swashplate 140 as position or displacement from a reference location of ram 124 changes.

For actuator 110, a position of EHV 120 can be monitored by EHV sensor 130, a position of MCV 122 can be monitored by MCV sensor 132, and a position of ram 124 can be monitored by ram sensor 134. Each of EHV sensor 130, MCV sensor 132, and ram sensor 134 can be powered by power supply 126 via power conveyed by excitation wiring 136.

Figure 2:
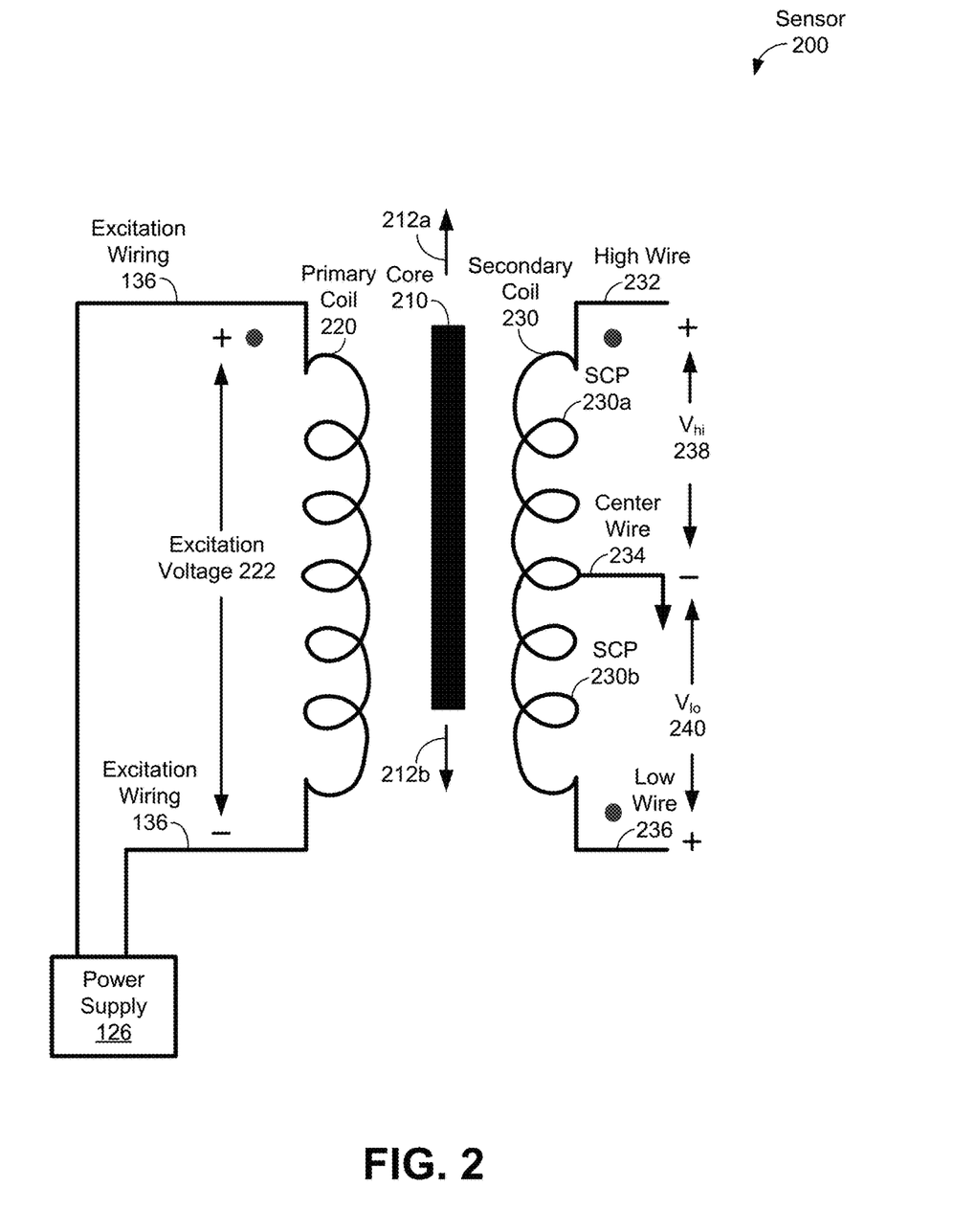
FIG. 2 is a diagram of a sensor according to an example embodiment.

FIG. 2 is a diagram of sensor 200 according to an example embodiment. One or more sensors 200 can be utilized to perform the functionality of EHV sensor 130, MCV sensor 132, and ram sensor 134; e.g., one sensor 200 can be used as EHV sensor 130, a second sensor 200 can be used as MCV sensor 132, and a third sensor 200 can be used as ram sensor 134.

Sensor 200 can be a LVDT that includes core 210, primary coil 220, and secondary coil 230. Primary coil 220 can receive power from power supply 126 via excitation wiring 136 and can cause voltage drop shown in FIG. 2 as excitation voltage 222. Current flowing through primary coil 220 can induce an induction current to flow through secondary coil 230. Secondary coil 230 includes three wires: high wire 232, center wire 234, and low wire 236. As shown in FIG. 2, a voltage drop of $V_{hi}$ 238 can occur between high wire 232 and center wire 234, and a voltage drop of $V_{lo}$ 240 can occur between center wire 234 and low wire 236. Core 210 can be made up of a magnetically permeable material (e.g., nickel-iron, iron, ferrite, nickel steel) moving along an axis within sensor 220 as indicated in FIG. 2 by vertical arrows 212a and 212b.

Movements by core 210 along the axis can cause changes in $V_{hi}$ 238 and $V_{lo}$ 240. Suppose that core 210 moves up with respect to FIG. 2; e.g., in the direction of arrow 212a. An upward movement of core 210 can cause core 210 to move closer to secondary coil portion 230a than to secondary coil portion 230b and correspondingly cause more magnetic flux and more power to be conveyed to secondary coil portion 230a relative to secondary coil portion 230b. As core 210 moves up within sensor 200, $V_{hi}$ 238 can increase relative to $V_{lo}$ 240 until core 210 reaches to an uppermost position within sensor 200, where $V_{hi}$ 238 reaches its maximum relative value compared to $V_{lo}$ 240.

In another example, suppose that core 210 moves down with respect to FIG. 2; e.g., in the direction of arrow 212b. A downward movement of core 210 can cause core 210 to move closer to secondary coil portion 230b than to secondary coil portion 230a and correspondingly cause more magnetic flux and more power to be conveyed to secondary coil portion 230b relative to secondary coil portion 230a. As core 210 moves down within sensor 200, $V_{lo}$ 240 increases relative to $V_{hi}$ 238 until core 210 reaches to an lowermost position within sensor 200, where reaches $V_{lo}$ 240 its maximum relative value compared to $V_{hi}$ 238.

Figure 3A:
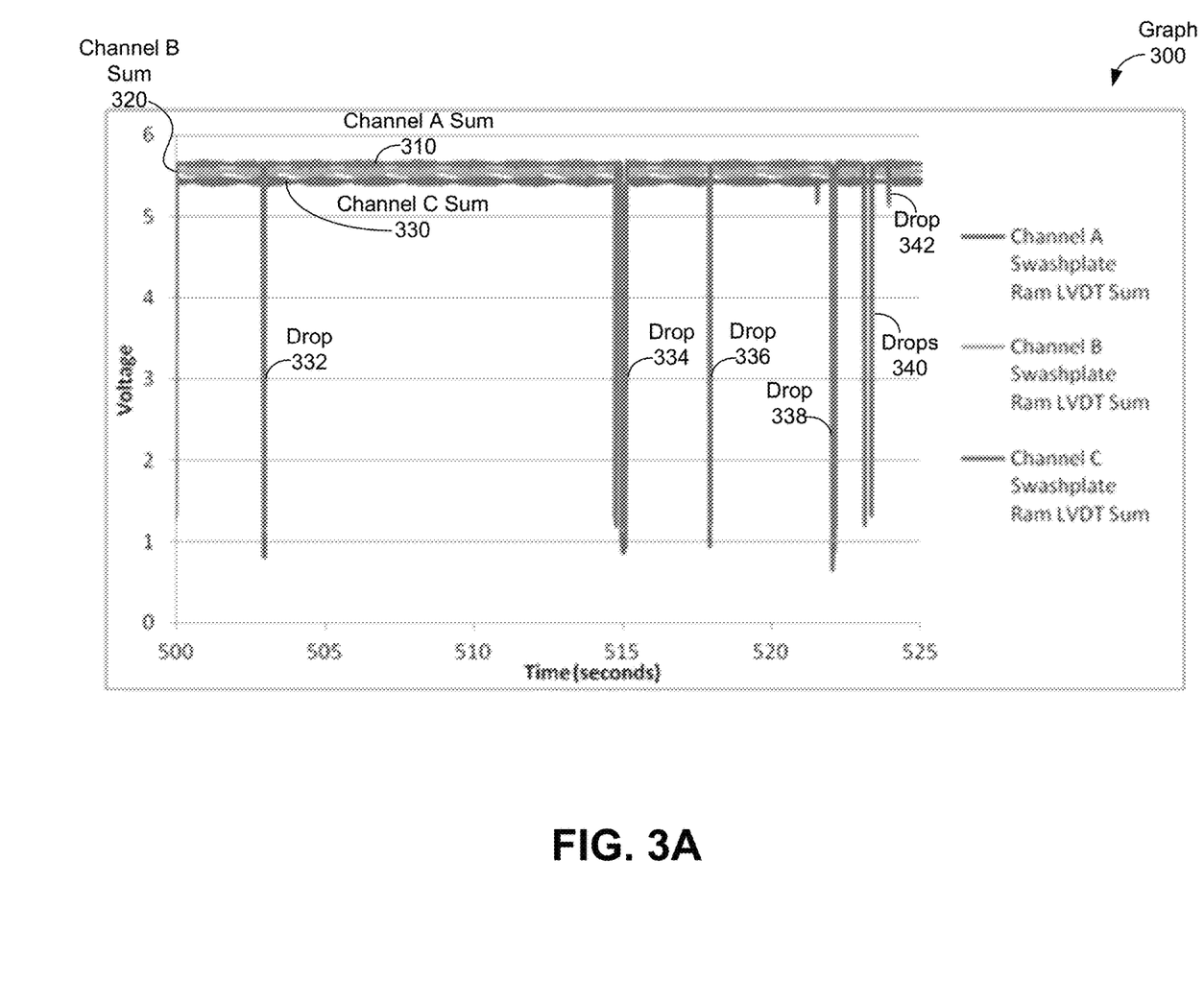
FIG. 3A illustrates a graph of voltage sums related to rams of three actuators according to an example embodiment.

FIG. 3A illustrates graph 300 of voltage sums 310, 320, 330 related to rams of three actuators according to an example embodiment. Graph 300 includes plots of voltage along a vertical (Y) axis as a function of time plotted along a horizontal (X) axis. The voltage plots depict voltage sum values from three sensors: Channel A Sum plot 310 depicts voltage sums over time from a Channel A swashplate ram sensor, Channel B Sum plot 320 depicts voltage sums over time from a Channel B swashplate ram sensor, and Channel C Sum plot 330 depicts voltage sums over time from a Channel C swashplate ram sensor.

Graph 300 shows voltage drops 332, 334, 336, 338, 340, 342 occurring from at least one of the Channel A, Channel B, and Channel C sensors during an approximate 25 second interval. For example, voltage drop 332 shows that sum voltages from Channel A, Channel B, and Channel C ram sensors drop from between 5.5 to 5.75 V to a range between 0.85 and 1.1 V within an approximate 150 millisecond (ms)

interval. Graph 300 shows similar voltage drops as drops 334, 336, 338, and 340 of graph 300. Drop 342 is a smaller voltage drop from between 5.5 to 5.75 V to a range between 5.2 and 5.45 V. As such, each of drops 332-340 can indicate an intermittent excitation wiring fault, as the voltages from each of the Channel A, Channel B, and Channel C sensors change in unison simultaneously.

Figure 3B:
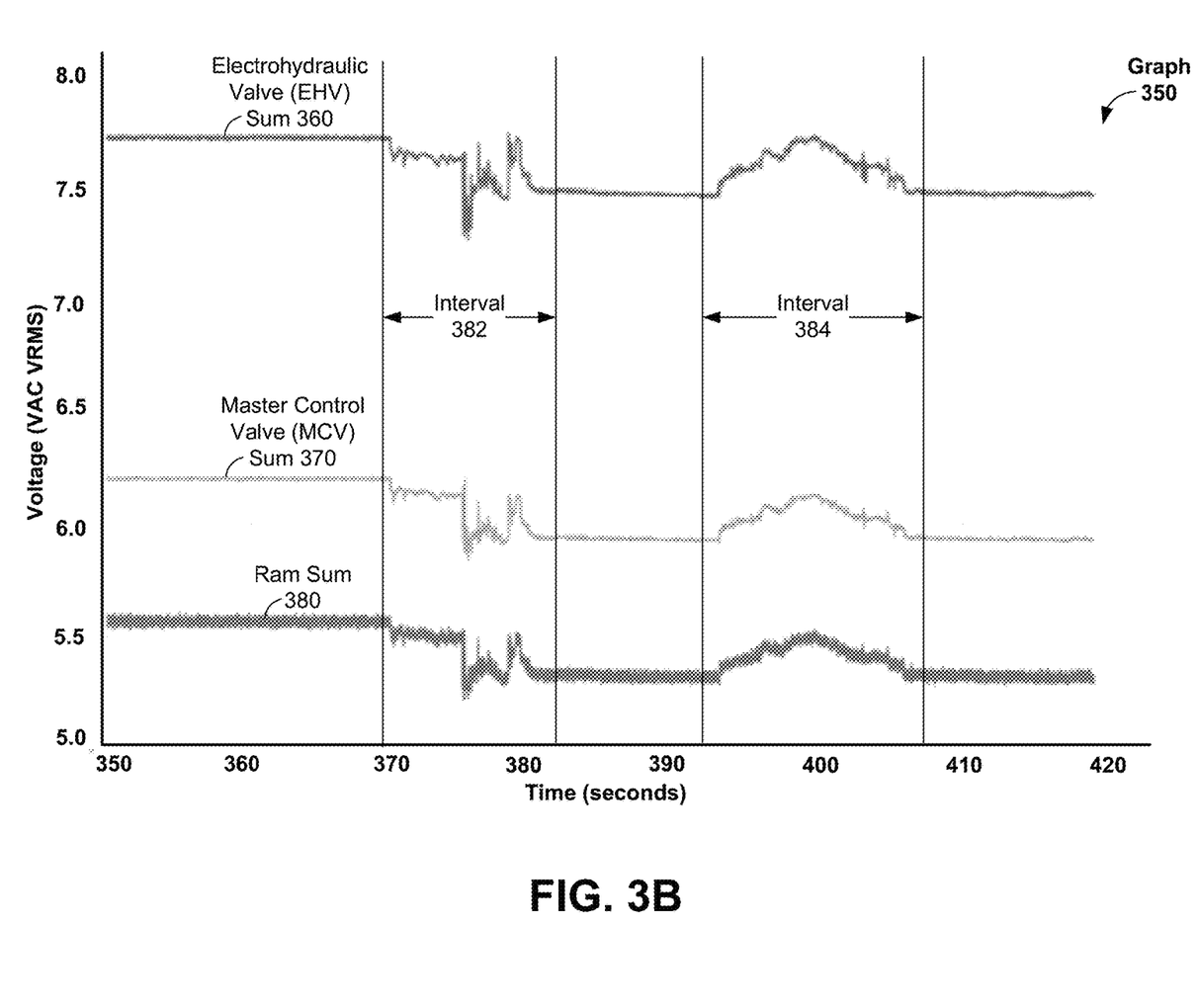
FIG. 3B illustrates a graph of voltage sums related to a ram and valves of an actuator according to an example embodiment.

FIG. 3B illustrates graph 350 of voltage sums related to a ram and valves of an actuator according to an example embodiment. Graph 350 includes plots of voltage along a vertical (Y) axis as a function of time plotted along a horizontal (X) axis. The voltage plots depict voltage sum values from three sensors: EHV sum plot 360 depicts voltage sums over time from a LVDT sensor monitoring an EHV of the actuator, MCV sum plot 370 depicts voltage sums over time from a LVDT sensor monitoring a MCV of the actuator, ram sum plot 380 depicts voltage sums over time from a LVDT sensor monitoring a ram of the actuator.

Graph 350 shows two intervals of time 382, 384 where voltages as depicted by plots 360, 370, and 380 change in unison simultaneously. For example, during interval 382, plot 360 indicates a sum value for the sensor monitoring the EHV starting at about 7.75 volts (at about 370 seconds), then dropping to a minimum of about 7.3 volts (at about 375 seconds), bouncing up to about 7.75 volts (at about 378 seconds) and then settling to a stable voltage of about 7.5 volts (at about 381 seconds). Similarly, during interval 380, plots 370 and 380 start at respective voltage values of about 6.2 and 5.6 volts (at about 370 seconds), drop to respective minima of about 5.85 and 5.2 volts (at about 375 seconds), bouncing up to respective voltages of about 6.2 and 5.6 volts (at about 378 seconds) and then settling to respective stable voltages of about 5.95 volts and 5.2 volts (at about 381 seconds). Similar changes in unison are shown for plots 360, 370, and 380 during interval 384 (between about the 392 and 408 second marks). As such, the simultaneous changes in unison for all three sensors during intervals 382 and 384 can indicate an intermittent excitation wiring fault.

Figure 4:
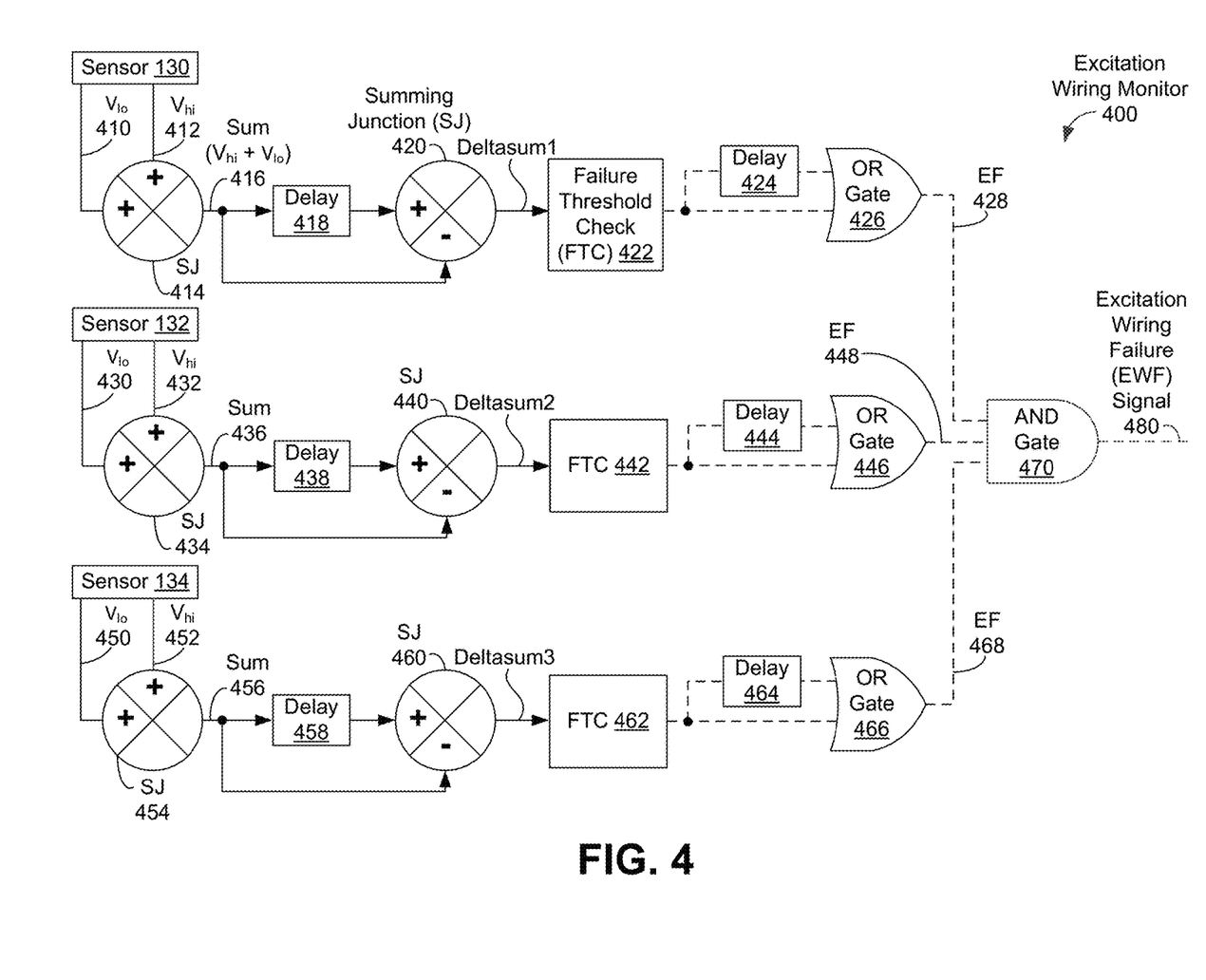
FIG. 4 is a circuit diagram for an excitation wiring monitor according to an example embodiment.

FIG. 4 is a circuit diagram for excitation wiring monitor 400 according to an example embodiment. Excitation wiring monitor 400 is configured to detect excitation wiring faults in excitation wiring for two or more sensors—three sensors are monitored in the embodiment shown in FIG. 4, while other embodiments of excitation wiring monitor 400 can monitor excitation wiring for fewer or more than three sensors.

Each of sensors 130, 132, and 134 can be a LVDT the same as (or similar to) sensor 200, and therefore can generate $V_{hi}$ and $V_{lo}$ voltages as discussed above in the context of FIG. 2. As shown in FIG. 4, sensor 130 can generate voltages $V_{lo}$ 410 and $V_{hi}$ 412, sensor 132 can generate voltages $V_{lo}$ 430 and $V_{hi}$ 432, and sensor 134 can generate voltages $V_{lo}$ 450 and $V_{hi}$ 452.

Voltages $V_{lo}$ 410 and $V_{hi}$ 412 from sensor 130 can be provided to summing junction (SJ) 414 to be added and so generate sum 416, where sum 416=$V_{lo}$ 410+$V_{hi}$ 412. Summing junction 420 can use sum 416 to determine a deltasum1 value by performing the following operation: deltasum1=delay-sum1-sum1, where delay-sum1 is the sum value produced by summing junction 414 after being delayed by delay 418, and where sum1 is the sum value produced by summing junction 414 without delay; e.g., sum 416.

For example, delay 418 can act to output its input value after a delay of one (or more) interval(s) of time. Suppose that delay 418 outputs its input value after a delay of I1 intervals of time; e.g., I1=1, 2, or some other positive value, and where an interval of time can be a number of seconds, clock cycles, or other units of time; e.g., 2 clock cycles, 1.5 nanoseconds, one or more iterations of a software loop, etc. Then, the output of delay 418 (that is, delay-sum1) at a time t+I1 will correspond to the output of summing junction 414 (that is, sum 416) at time t.

Then, FTC 422 can compare an absolute value of deltasum3 to a predetermined value (e.g., 0.01V, 0.05V, 0.1V, 0.2 V) to generate a logical TRUE value if the absolute value of deltasum1 exceeds the predetermined value or generate a logical FALSE value otherwise. That is, FTC 422 will generate a logical TRUE value when an absolute value of sum 416 has changed more than the predetermined value during the interval(s) of time consumed by delay 418.

An immediate output of FTC 422 and a delayed FTC output, produced after output of FTC 422 has been delayed by one or more intervals of time by delay 424, are both provided to OR gate 426. OR gate 426 can generate a logical TRUE value if either of its inputs have a logical TRUE value, or generate a logical FALSE value otherwise (that is, if both inputs to OR gate 426 have logical FALSE values). As such, an excitation failure (EF) signal 428 having a logical TRUE value is output by OR gate 426 if either the immediate output of FTC 422 or the delayed FTC output of FTC 422 is logically TRUE. Using OR gate 426 with inputs of both immediate and delayed outputs of FTC 422 enables capturing of faults over several intervals of time; that is, excitation failure signal 428 will be logically TRUE for the intervals of time that either the immediate output or the delayed output of FTC 422 is logically TRUE.

Voltages $V_{lo}$ 430 and $V_{hi}$ 432 from sensor 132 can be provided to summing junction 434 to be added and so generate sum 436, where sum 436=$V_{lo}$ 430+$V_{hi}$ 432. Sum 436 can be provided to summing junction 440 in order to determine a deltasum2 value by performing the following operation: deltasum2=delay-sum2-sum2, where delay-sum1 is the sum value produced by summing junction 434 after being delayed by delay 438, and where sum2 is the sum value produced by summing junction 434 without delay; e.g., sum 436. The operation of delay 438 is discussed above in the context of delay 418.

Then, FTC 442 can compare an absolute value of deltasum2 to a predetermined value (e.g., 0.01V, 0.05V, 0.1V, 0.2 V) to generate a logical TRUE value if the absolute value of deltasum2 exceeds the predetermined value or generate a logical FALSE value otherwise. That is, FTC 442 will generate a logical TRUE value when an absolute value of sum 436 has changed more than the predetermined value during the interval(s) of time consumed by delay 438.

An immediate output of FTC 442 and a delayed FTC output, produced after output of FTC 442 has been delayed by one or more intervals of time by delay 444, are both provided to OR gate 446. OR gate 446 can generate a logical TRUE value if either of its inputs have a logical TRUE value, or generate a logical FALSE value otherwise (that is, if both inputs to OR gate 446 have logical FALSE values). As such, an excitation failure signal 448 having a logical TRUE value is output by OR gate 446 if either the immediate output of FTC 442 or the delayed FTC output of FTC 442 is logically TRUE. Using OR gate 446 with inputs of both immediate and delayed outputs of FTC 442 enables capturing of faults over several intervals of time; that is, excitation failure signal 448 will be logically TRUE for the intervals of time that either the immediate output or the delayed output of FTC 442 is logically TRUE.

Voltages $V_{lo}$ 450 and $V_{hi}$ 452 from sensor 134 can be provided to summing junction 454 to be added and so generate sum 456, where sum 456=$V_{lo}$ 450+$V_{hi}$ 452. Sum 456 can be provided to summing junction 460 in order to determine a deltasum3 value by performing the following operation: deltasum3=delay-sum3-sum3, where delay-sum3 is the sum value produced by summing junction 454 after being delayed by delay 458, and where sum3 is the sum value produced by summing junction 454 without delay; e.g., sum 456. The operation of delay 458 is discussed above in the context of delay 418.

Then, FTC 462 can compare an absolute value of deltasum3 to a predetermined value (e.g., 0.01V, 0.05V, 0.1V, 0.2 V) to generate a logical TRUE value if the absolute value of deltasum3 exceeds the predetermined value or generate a logical FALSE value otherwise. That is, FTC 462 will generate a logical TRUE value when an absolute value of sum 456 has changed more than the predetermined value during the interval(s) of time consumed by delay 458.

An immediate output of FTC 462 and a delayed FTC output, produced after output of FTC 462 has been delayed by one or more intervals of time by delay 464, are both provided to OR gate 466. OR gate 466 can generate a logical TRUE value if either of its inputs have a logical TRUE value, or generate a logical FALSE value otherwise (that is, if both inputs to OR gate 466 have logical FALSE values). As such, an excitation failure signal 468 having a logical TRUE value is output by OR gate 466 if either the immediate output of FTC 462 or the delayed FTC output of FTC 462 is logically TRUE. Using OR gate 466 with inputs of both immediate and delayed outputs of FTC 462 enables capturing of faults over several intervals of time; that is, excitation failure signal 468 will be logically TRUE for the intervals of time that either the immediate output or the delayed output of FTC 462 is logically TRUE.

Each of excitation failure signals 428, 448, and 468 can be provided to AND gate 470, which can produce excitation wiring failure (EWF) signal 480. AND gate 470 can generate a logical TRUE value if all of its inputs have logical TRUE values or generate a logical FALSE value otherwise. That is, excitation wiring failure signal 480 will have a logical TRUE value when each of excitation failure signals 428, 448, and 468 has a logical TRUE value; otherwise, excitation wiring failure signal 480 will have a logical FALSE value.

In other embodiments, excitation wiring monitor 400 can monitor N sensors, for N>0. For example, each of the N sensors can be monitored by a circuit such as used to monitor sensor 130 to generate excitation failure signal 428; i.e., the above mentioned functions discussed in the context of summing junction 414, sum 416, delay 418, summing junction 420, deltasum1, FTC 422, delay 424, and OR gate 426 to generate excitation failure signal 428. The N=3 case is shown in FIG. 4 and discussed above. If N=1, then the excitation failure signal can be provided as an excitation wiring failure signal as well. For other cases (N=2 and N>3), each of the N excitation failure signals can be provided to an N input AND gate corresponding to AND gate 470 to generate an as excitation wiring failure signal equivalent to as excitation wiring failure signal 480 discussed above.

As such, excitation wiring failure signal 480 will have a logical TRUE value only when all three sum voltages (sums 416, 436, and 456) shift simultaneously or nearly simultaneously (all three sum voltages shift within the time intervals consumed by delays 418, 424 for sum 416, by delays 438, 444, for sum 436, and by delays 458, 464 for sum 456).

In some embodiments, a fault can be logged any or all of excitation failure signals 428, 448, 468, and excitation wiring failure signal 480 is logically TRUE. That is, if respective excitation failure signal 428, 448, 468 is logically TRUE, a log entry can be made to indicate a possible intermittent wiring failure in excitation wiring for respective sensor 130, 132, and 134. And, if excitation wiring failure signal 480 is logically TRUE, a log entry can be made to indicate a possible intermittent wiring failure in excitation wiring common to sensors 130, 132, and 134. These log entries can be generated and stored during operation of an actuator, such as during flight of aircraft 100 utilizing actuator 110 with sensors 130, 132, 134 to indicate intermittent wiring failures detected during actuator operation.

Figure 5:
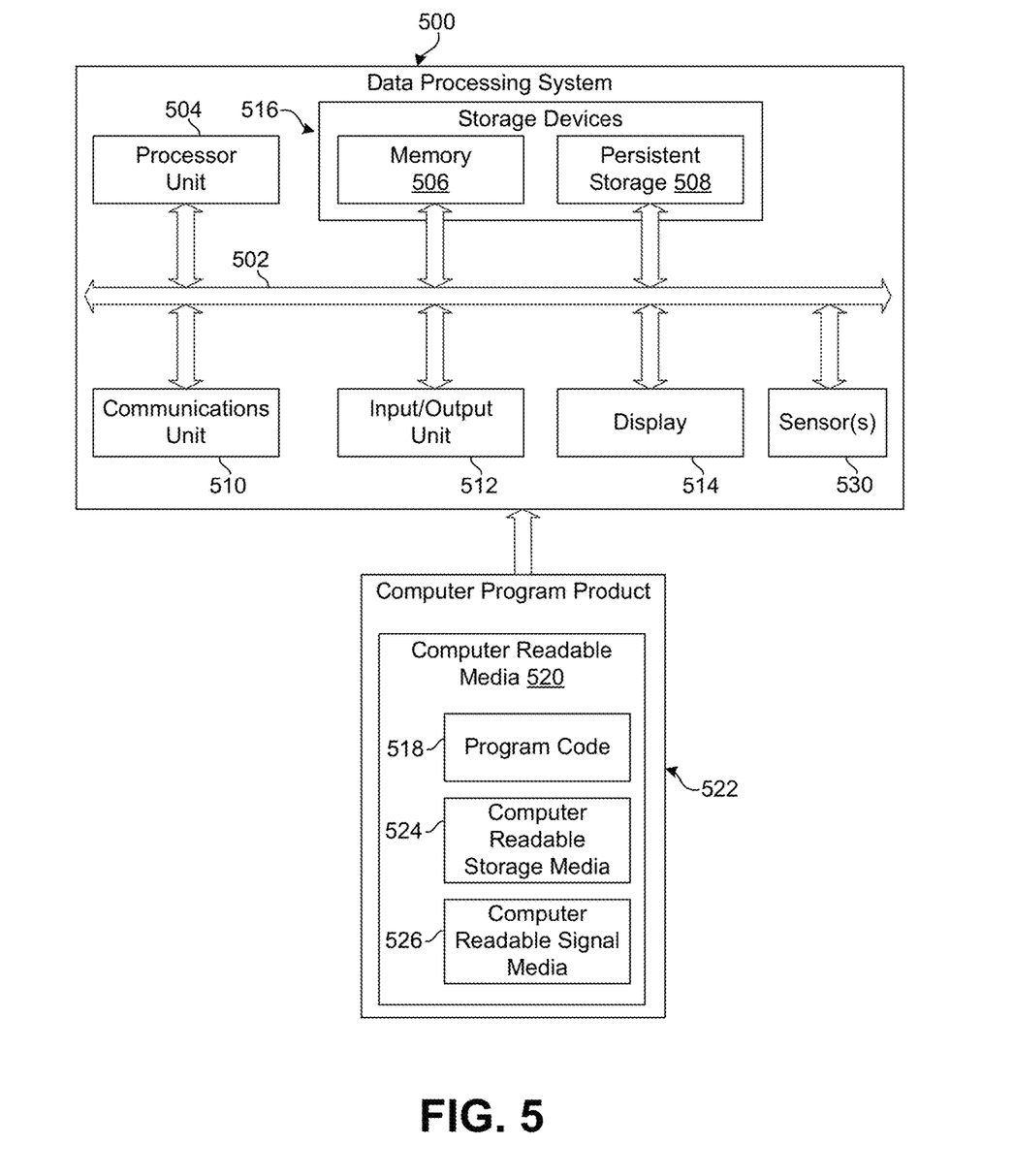
FIG. 5 is a block diagram of a data processing system according to an example embodiment.

FIG. 5 is a block diagram of data processing system 500 according to an example embodiment. In FIG. 5, data processing system 500 includes bus 502 that is configured for communicatively coupling processor unit 504, memory 506, persistent storage 508, communications unit 510, input/output (I/O) unit 512, and display 514.

In the present example, processor unit 504 is configured to execute software instructions that can be stored in memory 506. Processor unit 504 can include one or more high performance programmable processors, multi-core processors, or other types of processors.

Memory 506 and persistent storage 508 are examples of storage devices 516. Generally, a storage device is hardware that is capable of storing information; for example, data, program code, and/or other suitable information on a temporary basis and/or a permanent basis. Memory 506, in these examples, can be a random access memory (RAM) or any other suitable volatile or non-volatile storage device. Persistent storage 508 can be a hard drive, a flash memory, a rewritable optical disk, a rewritable magnetic tape, or some combination of the above. Media used by persistent storage 508 also can be removable, such as a removable hard drive, removable disk, or flash memory.

Communications unit 510, in these examples, can be configured to enable communications between data processing system 500 with other data processing systems or devices. For instance, communications unit 510 can be a network interface card. Generally, communications unit 510 can provide communications through physical links (e.g., wired links, fiber links) and/or wireless links.

Input/output unit 512 is configured to enable input and output of data with other devices that can be connected to the data processing system 500. For example, input/output unit 512 can enable user input through a keyboard, a mouse, a touchpad, a microphone for receiving voice commands, and/or other suitable input device(s) (e.g., keypads, buttons, game controllers, joysticks). Input/output unit 512 can send output to a printer, display 514, and/or other suitable output device(s) (e.g., speakers, haptic interface devices). Display 514 is configured to output visual information, including, but not limited to, text and imagery; for example, display 514 can include one or more liquid crystal displays (LCD), light emitting diodes (LEDs), displays using digital light processing (DLP) technology, cathode ray tubes (CRTs), and/or other similar devices.

Instructions for software, such as an operating system, applications, and/or other programs, can be located in storage devices 516, which can communicate with processor unit 504 through bus 502. Generally, the processes and functions of the disclosed embodiments can be performed by processor unit 504 using computer-readable instructions stored in a functional form on different physical or tangible computer readable media, such as memory 506 and/or persistent storage 508. The computer-readable instructions are referred to as program code, computer usable program code, or computer readable program code that can be read and executed by a processor in processor unit 504.

FIG. 5 also illustrates that program code 518 can be located in a functional form on computer readable media 520. Computer readable media 520 can be selectively removable and can be loaded onto or transferred to data processing system 200 for execution by processor unit 504. In the present example, program code 518 and computer readable media 520 form computer program product 522. Computer readable media 520 can include computer readable storage media 524 or computer readable signal media 526. Computer readable storage media 524 can take various forms, such as an optical or magnetic disk, a hard drive, a thumb drive, or a flash memory, that is connected to data processing system 500. In some instances, computer readable storage media 524 may be a non-transitory computer-readable storage medium.

Alternatively, program code 518 can be transferred to data processing system 500 using computer readable signal media 526. Computer readable signal media 526 can be, for example, a propagated data signal containing program code 518. For example, computer readable signal media 526 can be an electromagnetic signal, an optical signal, and/or any other suitable type of signal. Computer readable signal media 526 can be transmitted over wireless communications links, optical fiber cable, coaxial cable, a wire, and/or any other suitable type of communications link.

Sensor(s) 530 can be configured to measure conditions in an environment for data processing system 500 and provide data about that environment. The data can include, but is not limited to, location data about data processing system 500 (including, but not limited to, latitude, longitude, and/or altitude data), velocity (speed, direction) data about data processing system 500, acceleration data about computing device, and other data about the environment for data processing system 500, meteorological data about the environment (e.g., air temperature, humidity, barometric pressure, wind speed), and electromagnetic radiation data (e.g., infra-red, ultra-violet, X-ray data). Sensors 530 can include, but are not limited to, GPS sensor(s), location sensors(s), gyroscope(s), accelerometer(s), magnetometer(s), camera(s), light sensor(s), infrared sensor(s), ultraviolet sensor(s), X-ray sensor(s), meteorological sensor(s), and microphone(s).

The different components illustrated for the data processing system 500 are not meant to provide architectural limitations to the manner in which different embodiments can be implemented. Different embodiments can be implemented in a data processing system including components in addition to or in place of those illustrated for data processing system 500. Other components shown in FIG. 5 can be varied from the illustrative examples shown; e.g., program code 518 can be stored within memory 506. Generally, the different embodiments can be implemented using any hardware device or system capable of running program code.

In some embodiments, program code 518 can include instructions that cause data processing system to receive data from sensor(s) 530 to perform the functionality of excitation wiring monitor 400. For example, program code 518 can include computer-readable and executable instructions corresponding to the instructions shown in pseudo-code format in Table 1 to perform some or all of the functions of excitation wiring monitor 400.

TABLE 1

```
0001 // function to perform per-sensor excitation fault (EF) check
0002 Get_EF(sensor, *sum, delaysum, *ftc, delayftc, failure_threshold)
0003 {
0004    local vlo, vhi, deltasum;
0005
0006    ReadSensor(sensor, LO, &vlo); // get vlo from sensor
0007    ReadSensor(sensor, HI, &vhi); // get vhi from sensor
0008
0009    // take sum of vlo and vhi = operation of SJ 414 or 434 or 454
0010    (*sum) = vlo + vhi;
0011
0012    // take difference between delayed sum and current sum
0013    // generate delaysum1, delaysum2, or delaysum3 using respective SJ 420, 440, 460
0014    deltasum = delaysum − (*sum);
0015
0016    // perform failure threshold check of FTC 422 or 442 or 462
0017    (*ftc) = ((abs(deltasum)) > failure_threshold);
0018
0019    // let excitation fault (boolean) value = current FTC OR delayed ftc
0020    // operation of OR Gate 424 or 444 or 464
0021    ef = ((*ftc) || delayftc);
0022    return(ef);
0023 } // end of GetEF( )
0024
0025 done_yet( ) // function to decide if EW_monitor function is done
0026 {
0027    return(FALSE); // always return not done
0028    // done_yet can be more complex in other embodiments
0029 }
0030
0031 // main function for performing functionality of excitation wiring monitor 400
0032
0033 EW_monitor( )
0034 {
0035    // declarations / initializations
0036    local done = FALSE; // monitoring loop not done yet
0037    // initialize monitor-related variables
0038    local FAILURE_THRESHOLD = 0.1; // example failure threshold value
0039    local Delay_sum416 = Sum_416 = 0; // delayed and current sum values for sensor 130
```

TABLE 1-continued

```
0040    local Delay_sum436 = Sum_436 = 0; // delayed and current sum values for sensor 132
0041    local Delay_sum456 = Sum_456 = 0; // delayed and current sum values for sensor 134
0042
0043    local Delay_ftc422 = Ftc_422 = 0; // delayed and current FTC values for sensor 130
0044    local Delay_ftc442 = Ftc_442 = 0; // delayed and current FTC values for sensor 132
0045    local Delay_ftc462 = Ftc_462 = 0; // delayed and current FTC values for sensor 134
0046    local EF_428 = EF_448 = EF_468 = EWF_Signal_480 = 0 // exc. fault / EWF signals
0047    // main monitoring loop starts on the next line
0048    while (done == FALSE)
0049    {
0050      // copy current data to delayed data
0051      Delay_sum416 = Sum_416;
0052      Delay_ftc422 = Ftc_422;
0053      Delay_sum436 = Sum_436;
0054      Delay_ftc442 = Ftc_442;
0055      Delay_sum456 = Sum_456;
0056      Delay_ftc462 = Ftc_462;
0057
0058      // Do excitation fault check for sensor 130 (providing v_lo 410 and v_hi 412)
0059      EF_428 = Get_EF(SENSOR130, &Sum_416, Delay_sum416,
0060                      &Ftc_422, Delay_ftc422, FAILURE_THRESHOLD);
0061
0062      // Do excitation fault check for sensor 132 (providing v_lo 430 and v_hi 432)
0063      EF_448 = Get_EF(SENSOR132, &Sum_436, Delay_sum436,
0064                      &Ftc_442, Delay_ftc442, FAILURE_THRESHOLD);
0065
0066      // Do excitation fault check for sensor 134 (providing v_lo 450 and v_hi 452)
0067      EF_468 = Get_EF(SENSOR135, &Sum_456, Delay_sum456,
0068                      &Ftc_462, Delay_ftc462, FAILURE_THRESHOLD);
0069
0070      // Do three sensor excitation fault check (functionality of AND gate 470)
0071      EWF_Signal_480 = ((EF_428) && (EF_448) && (EF_468));
0072
0073      // in some embodiments, next if statement can be used to log occurrence of a raised
0074      // EWF signal to save indication of (possible) intermittent wiring fault
0075      if (EWF_Signal_480 == TRUE) // if EF signal 480 is raised/set to TRUE
0076      {
0077        // save signal in log, perhaps with other data (e.g., timestamp, sensor IDs, etc.)
0078        Log_Signal(EWF_Signal_480);
0079      } // end of if statement
0080
0081      // in other embodiments, can use similar if statements for logging EF_428,
0082      // EF_448, and/or EF_468
0083
0084      done = done_yet( ); // determine if done with monitoring loop
0085    } // end of the main monitoring loop
0086 } // end of EW_monitor function
0086
0087 main( ) // the main routine
0088 {
0089   EW_monitor( ); // just run the excitation wiring monitor...
0090   // main can be more complex in other embodiments
0091 }// end of main routine
```

The execution of instructions of Table 1 above can begin with the main routine starting at line 0087. The main routine has one instruction—a call to a EW_monitor function at line 0089. The EW_monitor function, which has no parameters, begins at line 0033 of Table 1. After initializing several variables at lines 0035 to 0047, the EW_monitor function begins a while loop at line 0048.

An iteration of the while loop begins at line 0051, where a value of sum 416 is stored in a Delay_sum416 variable to simulate operation of delay 418. At line 0052, a value of failure threshold check (ftc) 422 is stored in a Delay_ftc422 variable to simulate operation of delay 424. Lines 0053-0056 similarly simulate operations of respective delays 438, 444, 458, and 464. Then, at line 0059, the EW_monitor function calls the Get_EF function for sensor 130.

The Get_EF function is defined starting at line 0002 of Table 1. Line 0002 indicates that Get_EF takes six parameters as inputs: a sensor parameter, a sum parameter, a delaysum parameter, an ftc parameter, a delayfic, and a failure_threshold parameter. Utilizing C-style syntax, the sum and ftc parameters are preceded by an asterisk "*" to indicate that using the terminology "*sum" or "*ftc" in Get_EF will change the value of the respective sum or ftc parameter after termination of the Get_EF function.

In this example, a ReadSensor function is assumed to be provided by an operating system and/or other software of data processing system 500 for interacting with sensors such as but not necessarily limited to, sensors 130, 132, 134, 200, and 530. The example ReadSensor function takes three parameters: a sensor parameter to identify a sensor to be read, a read-type parameter to identify one or more values of the sensor to be read, and an output value parameter to store the value(s) read from the sensor. For this example, the read-type parameter can take at least two values: "HI" to read a high voltage ($V_{hi}$) value of an LVDT sensor and "LO" to read a low voltage value ($V_{lo}$) of the LVDT sensor, where the LVDT sensor can be, but is not limited to, at least one of sensors 130, 132, 134, 200, and 530. In other examples, the ReadSensor function could be used to read other data from one or more sensors.

At line 0006, the Get_EF function calls the ReadSensor function to read a particular sensor's low voltage value. The particular sensor is indicated by the sensor parameter, and the resulting low voltage value is stored in a "vlo" local variable of the Get_EF function. At line 0007, the Get_EF function calls the ReadSensor function to read the sensor's high voltage value and the resulting high voltage value is stored in a "vhi" local variable of the Get_EF function.

Then, at line 0010, a voltage sum ($V_{hi}+V_{lo}$) is calculated, such as the sums calculated by summing junctions 414, 434, and 454, and stored in the sum parameter. At line 0014, a deltasum value is determined by subtracting the sum value from the delaysum parameter value such as the deltasum1, deltasum2, and deltasum3 values calculated by respective summing junctions 420, 440, and 460. At line 0017, the failure threshold check is performed by first taking the absolute value of deltasum and determining whether the absolute value is greater than the failure_threshold value. If the absolute value is greater than the failure_threshold value, then the value of the ftc parameter is set to a logical TRUE value; otherwise, the value of the ftc parameter is set to a logical FALSE value. In this example, the failure_threshold parameter is set to the FAILURE_THRESHOLD value of 0.1 (see line 0038 of the EW_monitor function) for each of the three calls to the Get_EF function made on lines 0060, 0064, and 0068 of EW_monitor. In this example, the value of the ftc parameter will be set to a logical TRUE value if the absolute value of deltasum is greater than 0.1. Other values of the failure_threshold parameter are possible as well.

The Get_EF function continues at line 0021 by setting a value of an ef variable equal to a logical OR of the value of the ftc parameter with the value of the delayfic parameter, such as carried out by OR gate 424, 444, or 464. The value of the ef variable is used as return value of the Get_EF function at line 0022. The Get_EF function ends at line 0023.

Upon return from the first Get_EF function call at lines 0059-0060 for sensor 130, the value of the EF_428 variable, which corresponds to excitation failure signal 428, is set to the return value of the Get_EF function call. Similarly, the value of the EF_448 variable, corresponding to excitation failure signal 448, is set to the return value of the Get_EF function call at lines 0063-0064 for checking excitation wiring of sensor 132. Further, the value of the EF_468 variable, corresponding to excitation failure signal 468, is set to the return value of the Get_EF function call at lines 0063-0064 that checks excitation wiring of sensor 134.

At line 0071, the EW_monitor function performs the functionality of AND gate 470 by setting an EWF_Signal_480 variable's value to the logical AND of the EF_428, EF_448, and EF_468 variables, where the EWF_Signal_480 variable corresponds to excitation wiring failure signal 480 of excitation wiring monitor 400. At lines 0075-0079, if the EWF_Signal_480 variable is equal to a logical TRUE value, then a Log_Signal function is called to log and/or otherwise store the value of the EWF_Signal_480 variable and perhaps other information in a log file or other record(s). The other information can include, but is not limited to, a timestamp, additional timing information, sensor identifier(s), actuator identifier(s), and/or aircraft identifier(s). Other data can be logged as well or instead; e.g., values of the EF_428, EF_448, EF_468 variables, voltage data from the sensors, sum/delayed sum values, and failure threshold check/delayed failure threshold check values.

The done_yet function shown at lines 0025-0029 is called at line 0084 of the EW_monitor function to set a new value of the done variable controlling a main loop between lines 0048 and 0085 of the EW_monitor function. In this example, the done_yet function always returns a logical FALSE value, and so the main loop is effectively an infinite loop to provide continuous monitoring of the excitation wiring 136 for sensors 130, 132, 134, just as can be provided by excitation wiring monitor 400.

In some embodiments, N>0 sensors can be monitored. In those embodiments, the three Get_EF function calls on lines 0059-0068 of Table 1 above can be replaced/updated with N Get_EF function calls to monitor the N sensors. Also, the statement on line 0071 for determining EWF_Signal_480 can be modified to perform a logical AND operation of the N return values of the N Get_EF function calls.

Figure 6:
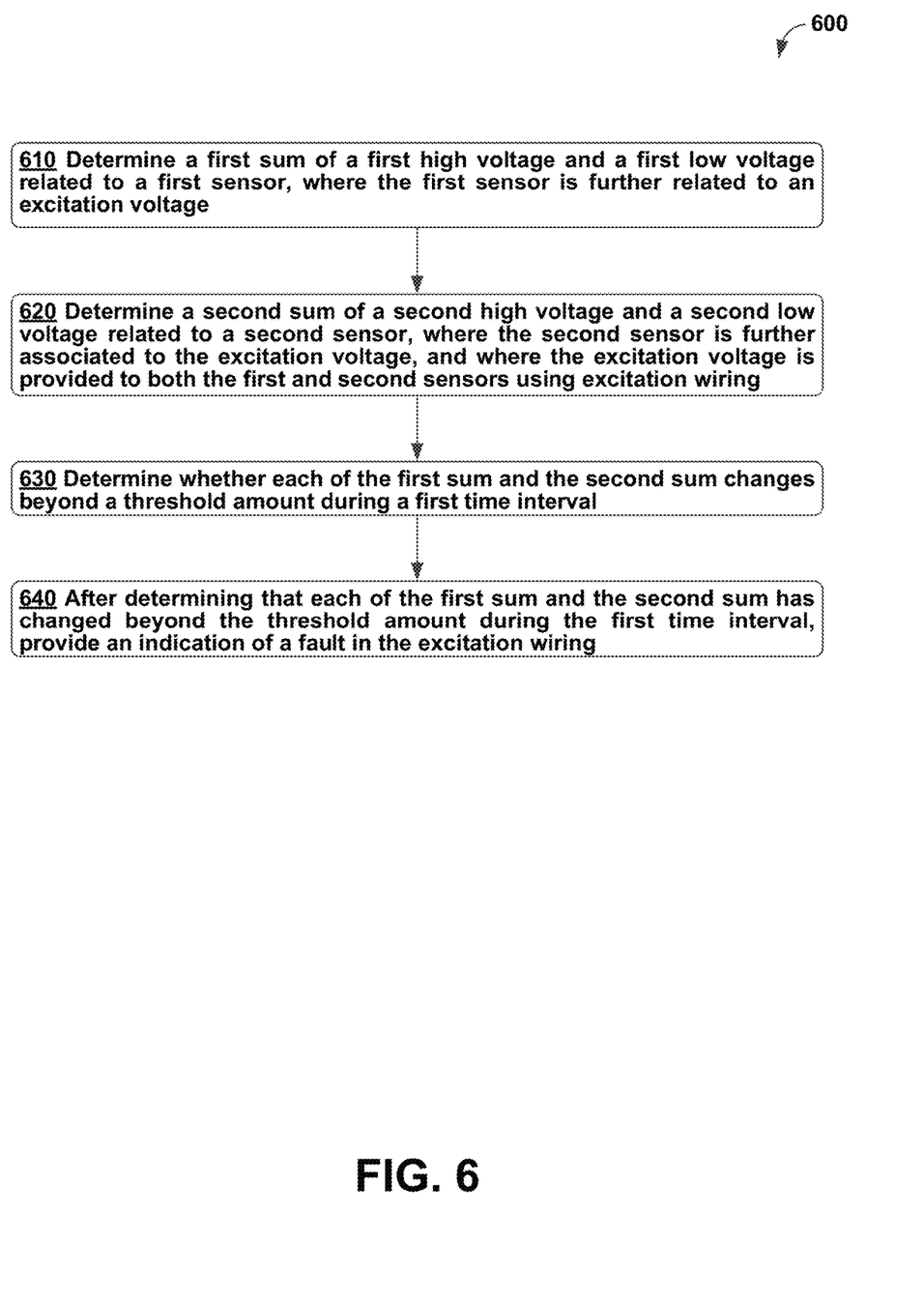
FIG. 6 is a flowchart of a method for detecting faults in excitation wiring, according to an example embodiment.

FIG. 6 is a flowchart of method 600 for detecting faults in excitation wiring, according to an example embodiment. Method 600 shown in FIG. 6 presents an embodiment that can be performed within the embodiments of FIGS. 1-5, for example. Thus, devices and systems disclosed herein can be used or configured to perform logical functions presented in FIG. 6. In some instances, components of the devices and systems can be configured to perform the functions such that the components are actually configured and structured (with hardware and/or software) to enable such performance. In other examples, components of the devices and systems can be arranged to be adapted to, capable of, or suited for performing the functions.

Method 600 can include one or more operations, functions, or actions as illustrated by herein-described blocks of FIG. 6. Although the blocks are illustrated in a sequential order, these blocks may also be performed in parallel, and/or in a different order than described herein. Also, the various blocks may be combined into fewer blocks, divided into additional blocks, and/or removed based upon the desired implementation. In some embodiments, method 600 can be carried out by circuitry, such as excitation wiring monitor 400, while in other embodiments, method 600 can be carried out by a data processing system, such as data processing system 500, executing computer-executable instructions configure to perform the functions of method 600; e.g., computer-executable instructions that are the same as or similar to the pseudo-code shown in Table 1.

Method 600 can begin at block 610, where a first sum of a first high voltage and a first low voltage related to a first sensor can be determined. The first sensor can be further related to an excitation voltage. In some embodiments, the first sensor and the second sensor can both be associated with an actuator. In particular of these embodiments, the actuator can be configured to move a swashplate of an aircraft.

At block 620, a second sum of a second high voltage and a second low voltage related to a second sensor can be determined. The second sensor can be further related to the excitation voltage. The excitation voltage can be provided to both the first and second sensors using excitation wiring.

At block 630, a determination can be made whether each of the first sum and the second sum changes beyond a threshold amount during a first time interval. In some embodiments, whether the first sum changes during the first time interval can include determining a first-portion sum value during a first portion of the first time interval; determining a second-portion sum value during a second portion of the first time interval, where the first portion of the first time interval precedes the second portion of the first time interval; determining whether a sum of the first-portion sum value and the second-portion sum value is the threshold amount; and after determining that the sum of the first-portion sum value and the second-portion sum value is not within the threshold amount, determining that the first sum changes during the first time interval.

In other embodiments, determining whether each of the first sum and the second sum changes beyond the threshold amount during the first time interval can include: generating a first indication whether the first sum has changed during the first time interval; generating a second indication whether the first sum has changed during the first time interval by delaying the first indication by a predetermined amount of time; and determining whether the first sum has changed during the first time interval based on the first indication and the second indication.

In still other embodiments, determining whether each of the first sum and the second sum changes beyond the threshold amount during the first time interval can include: determining a first logical value indicating whether the first sum changes beyond the threshold amount during the first time interval; determining a second logical value indicating whether the second sum changes beyond the threshold amount during the first time interval; and determining whether each of the first sum and the second sum changes beyond the threshold amount during the first time interval based on a logical combination of the first logical value and the second logical value. In particular of these embodiments, the logical combination can include a logical AND operation.

At block 640, after determining that each of the first sum and the second sum has changed beyond the threshold amount during the first time interval, providing an indication of a fault in the excitation wiring.

In some embodiments, method 600 can further include: determining a third sum of a third high voltage and a third low voltage related to a third sensor, where the third sensor is further related to the excitation voltage, and where the excitation wiring further provides the excitation voltage to the third sensor, determining whether the third sum changes beyond the threshold amount during the first time interval; and after determining that each of the first sum, the second sum, and the third sum has changed beyond the threshold amount during the first time interval, providing the indication of the fault in the excitation wiring.

Disclosed embodiments are described above with reference to the accompanying drawings, in which some, but not all of the disclosed embodiments may be shown. Indeed, several different embodiments may be described and should not be construed as limited to the embodiments set forth herein. Rather, these embodiments are described so that this disclosure are thorough and complete and convey the disclosure at least to those skilled in the art.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent from the foregoing descriptions. Such modifications and variations are intended to fall within the scope of the appended claims.

It should be understood that for the processes and methods disclosed herein, flowcharts show functionality and operation of possible implementations of respective embodiments. In this regard, each block may represent a module, a segment, or a portion of program code, which includes one or more instructions executable by a processor for implementing specific logical functions or steps in the process.

The program code may be stored on any type of computer readable medium or data storage, for example, such as a storage device including a disk or hard drive. The computer readable medium may include non-transitory computer readable medium or memory, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a tangible computer readable storage medium, for example.

In addition, each block in the disclosed flowcharts may represent circuitry that is wired to perform the specific logical functions in the process. Alternative implementations are included within the scope of the example embodiments of the present disclosure in which functions may be executed out of order from that shown or discussed, including substantially concurrent or in reverse order, depending on the functionality involved, as would be understood by those reasonably skilled in the art.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. A method of detecting faults in excitation wiring, comprising:
    providing an excitation voltage from a power supply to at least a first sensor and a second sensor using excitation wiring that connects the power supply and at least the first and second sensors;
    determining a first high voltage and a first low voltage related to the excitation voltage using the first sensor;
    determining a second high voltage and a second low voltage related to the excitation voltage using the second sensor;
    determining a first sum of the first high voltage and the first low voltage;
    determining a second sum of the second high voltage and the second low voltage;
    determining whether each of the first sum and the second sum changes beyond a threshold amount during a first time interval; and
    after determining that each of the first sum and the second sum has changed beyond the threshold amount during the first time interval, providing an indication of a fault in the excitation wiring.

2. The method of claim 1, wherein the excitation wiring further connects the power supply and a third sensor,
    wherein providing the excitation voltage from the power supply to at least the first sensor and the second sensor further comprises providing the excitation voltage to the third sensor using the excitation wiring, and wherein the method further comprises:
    determining a third high voltage and a third low voltage related to the excitation voltage using the third sensor;
    determining a third sum of the third high voltage and the third low voltage;
    determining whether the third sum changes beyond the threshold amount during the first time interval; and after determining that each of the first sum, the second sum, and the third sum has changed beyond the threshold amount during the first time interval, providing the indication of the fault in the excitation wiring.

3. The method of claim 1, wherein determining whether the first sum changes during the first time interval comprises:
determining a first-portion sum value during a first portion of the first time interval;
determining a second-portion sum value during a second portion of the first time interval, wherein the first portion of the first time interval precedes the second portion of the first time interval;
determining whether a sum of the first-portion sum value and the second-portion sum value is within the threshold amount; and
after determining that the sum of the first-portion sum value and the second-portion sum value is not within the threshold amount, determining that the first sum changes during the first time interval.

4. The method of claim 1, wherein the first sensor and the second sensor are both included within an actuator.

5. The method of claim 4, wherein the actuator is configured to move a swashplate of an aircraft.

6. The method of claim 1, wherein determining whether each of the first sum and the second sum changes beyond the threshold amount during the first time interval comprises:
generating a first indication whether the first sum has changed during the first time interval;
generating a second indication whether the first sum has changed during the first time interval by delaying the first indication by a predetermined amount of time; and
determining whether the first sum has changed during the first time interval based on the first indication and the second indication.

7. The method of claim 1, wherein determining whether each of the first sum and the second sum changes beyond the threshold amount during the first time interval comprises:
determining a first logical value indicating whether the first sum changes beyond the threshold amount during the first time interval;
determining a second logical value indicating whether the second sum changes beyond the threshold amount during the first time interval; and
determining whether each of the first sum and the second sum changes beyond the threshold amount during the first time interval based on a logical combination of the first logical value and the second logical value.

8. The method of claim 7, wherein the logical combination comprises a logical AND operation.

9. A device, comprising:
a power supply providing an excitation voltage,
a first sensor and a second sensor,
excitation wiring connecting the power supply and at least the first and second sensors, wherein the device is configured for:
determining a first high voltage and a first low voltage related to the excitation voltage using the first sensor;
determining a second high voltage and a second low voltage related to the excitation voltage using the second sensor;
determining a first sum of the first high voltage and the first low voltage;
determining a second sum of the second high voltage and the second low voltage;
determining whether each of the first sum and the second sum changes beyond a threshold amount during a first time interval; and
after determining that each of the first sum and the second sum has changed beyond the threshold amount during the first time interval, providing an indication of a fault in the excitation wiring.

10. The device of claim 9, wherein the device further comprises a third sensor,
wherein the excitation wiring further connects the power supply and the third sensor, wherein providing the excitation voltage from the power supply to at least the first sensor and the second sensor further comprises providing the excitation voltage to the third sensor using the excitation wiring, and
wherein the device is further configured for:
determining a third high voltage and a third low voltage related to the excitation voltage using the third sensor;
determining a third sum of the third high voltage and the third low voltage;
determining whether the third sum changes beyond the threshold amount during the first time interval; and
after determining that each of the first sum, the second sum, and the third sum has changed beyond the threshold amount during the first time interval, providing the indication of the fault in the excitation wiring.

11. The device of claim 9, wherein determining whether the first sum changes during the first time interval comprises:
determining a first-portion sum value during a first portion of the first time interval;
determining a second-portion sum value during a second portion of the first time interval, wherein the first portion of the first time interval precedes the second portion of the first time interval;
determining whether a sum of the first-portion sum value and the second-portion sum value is within the threshold amount; and
after determining that the sum of the first-portion sum value and the second-portion sum value is not within the threshold amount, determining that the first sum changes during the first time interval.

12. The device of claim 9, wherein the first sensor and the second sensor are both included within an actuator.

13. The device of claim 12, wherein the actuator is configured to move a swashplate of an aircraft.

14. The device of claim 9, wherein determining whether each of the first sum and the second sum changes beyond the threshold amount during the first time interval comprises:
generating a first indication whether the first sum has changed during the first time interval;
generating a second indication whether the first sum has changed during the first time interval by delaying the first indication by a predetermined amount of time; and
determining whether the first sum has changed during the first time interval based on the first indication and the second indication.

15. The device of claim 9, wherein determining whether each of the first sum and the second sum changes beyond the threshold amount during the first time interval comprises:
determining a first logical value indicating whether the first sum changes beyond the threshold amount during the first time interval;

determining a second logical value indicating whether the second sum changes beyond the threshold amount during the first time interval; and determining whether each of the first sum and the second sum changes beyond the threshold amount during the first time interval based on a logical combination of the first logical value and the second logical value.

16. The device of claim 15, wherein the logical combination comprises a logical AND.

17. A computing device, comprising:
one or more processors; and
computer readable media configured to store at least program code that, when executed by the one or more processors, causes the computing device to perform functions comprising:
determining a first sum of a first high voltage and a first low voltage that are related to an excitation voltage, the first high voltage and first low voltage determined by a first sensor, wherein the first sensor and a second sensor receive the excitation voltage from a power supply using excitation wiring that connects the power supply with at least the first and second sensors;
determining a second sum of a second high voltage and a second low voltage that are related to the excitation voltage, the second high voltage and second low voltage determined by the second sensor;
determining whether each of the first sum and the second sum changes beyond a threshold amount during a first time interval; and
after determining that each of the first sum and the second sum has changed beyond the threshold amount during the first time interval, providing an indication of a fault in the excitation wiring.

18. The computing device of claim 17, wherein the excitation wiring further connects the power supply and a third sensor,
wherein the third sensor receives the excitation voltage from the power supply and determines a third high voltage and third low voltage related to the excitation voltage, and wherein the functions further comprise:
determining a third sum of the third high voltage and the third low voltage;
determining whether the third sum changes beyond the threshold amount during the first time interval; and
after determining that each of the first sum, the second sum, and the third sum has changed beyond the threshold amount during the first time interval, providing the indication of the fault in the excitation wiring.

19. The computing device of claim 17, wherein determining whether the first sum changes during the first time interval comprises:
determining a first-portion sum value during a first portion of the first time interval;
determining a second-portion sum value during a second portion of the first time interval, wherein the first portion of the first time interval precedes the second portion of the first time interval;
determining whether a sum of the first-portion sum value and the second-portion sum value is within the threshold amount; and
after determining that the sum of the first-portion sum value and the second-portion sum value is not within the threshold amount, determining that the first sum changes during the first time interval.

20. The computing device of claim 19, wherein the first sensor and the second sensor are both included within an actuator, and wherein the actuator is configured to move a swashplate of an aircraft.

* * * * *